(12) United States Patent
Snoeij et al.

(10) Patent No.: US 8,212,606 B2
(45) Date of Patent: Jul. 3, 2012

(54) APPARATUS AND METHOD FOR OFFSET DRIFT TRIMMING

(75) Inventors: Martijn F. Snoeij, Nuremberg (DE); Mikhail V. Invanov, Erlangen (DE)

(73) Assignee: Texas Instruments Deutschland GmbH, Freising (DE)

( * ) Notice: Subject to any disclaimer, the term of this patent is extended or adjusted under 35 U.S.C. 154(b) by 14 days.

(21) Appl. No.: 12/876,708

(22) Filed: Sep. 7, 2010

(65) Prior Publication Data

US 2011/0057718 A1    Mar. 10, 2011

(30) Foreign Application Priority Data

Sep. 8, 2009 (DE) .......... 10 2009 040 543

(51) Int. Cl.
*H03K 17/14* (2006.01)
*G05F 3/22* (2006.01)
*H03F 3/45* (2006.01)
(52) U.S. Cl. ......... 327/513; 327/538; 323/907; 330/256
(58) Field of Classification Search .......... None
See application file for complete search history.

(56) References Cited

U.S. PATENT DOCUMENTS

| 7,750,728 | B2 * | 7/2010 | Marinca | 327/539 |
| 7,777,558 | B2 * | 8/2010 | Chen | 327/539 |
| 2003/0155974 | A1 | 8/2003 | Ivanov et al. | |
| 2006/0267127 | A1 * | 11/2006 | Kim | 257/467 |

FOREIGN PATENT DOCUMENTS

DE    10132803    12/2002

OTHER PUBLICATIONS

DE Search Report dated Jun. 23, 2010.

* cited by examiner

*Primary Examiner* — Lincoln Donovan
*Assistant Examiner* — Terry L Englund
(74) *Attorney, Agent, or Firm* — John J. Patti; Wade J. Brady, III; Frederick J. Telecky, Jr.

(57) ABSTRACT

An apparatus is provided that includes a drift trimming stage that includes a first current source providing a current with a first temperature dependency and a second current source providing a current with a second temperature dependency. The first and the second current source are coupled at a first node and configured to have equal currents at a first temperature. There is further a third current source providing a current with a third temperature dependency and a fourth current source providing a current with a fourth temperature dependency. The third current source and the fourth current source are coupled at a second node and configured to have equal currents at the first temperature. There is a first resistor coupled between the first node and a third node, a second resistor coupled between the second node and the third node. The first node and the second node are coupled to provide a combined voltage drop across the first resistor and the second resistor for reducing the offset drift.

18 Claims, 4 Drawing Sheets

APPARATUS AND METHOD FOR OFFSET DRIFT TRIMMING

CROSS-REFERENCE TO RELATED APPLICATIONS

This application claims priority from German Patent Application No. 10 2009 040 543.7, filed Sep. 8, 2009, which is hereby incorporated by reference for all purposes.

FIELD OF THE INVENTION

The invention generally relates to amplifiers and, more particularly, to reducing an offset drift of an amplifier.

BACKGROUND

Offset is a direct current (DC) parameters of an operational amplifier. The offset of an operational amplifier is not constant but changes if the operating temperature of the amplifier changes. The change of offset is referred to as offset drift. In order to reduce offset and offset drift, many amplifiers are trimmed at the wafer or package level. Bipolar input amplifiers (i.e., amplifiers implemented as an integrated circuit that use bipolar transistors coupled to the amplifier input) generally have a single trimming step at one temperature because the offset and offset drift are correlated. If the offset is trimmed to be zero, the offset drift will usually also be zero. Amplifiers having junction field effect transistor (JFET) or complementary metal oxide field effect transistor (MOSFET) input stages generally have more than one trimming step as offset and offset drift are not correlated. In order to reduce offset and offset drift in JFET or MOSFET amplifiers, a two-step trimming method can be applied. The amplifier is then adjusted in two consecutive steps at two different temperatures.

An example of a conventional circuits and/or methods are: U.S. Patent Pre-Grant Publ. No. 2003/0155974; and German Patent No. DE10132803.

SUMMARY

It is an object of the invention to provide a method for an apparatus, in particular an integrated semiconductor apparatus, configured to reduce offset and offset drift of an amplifier that can be used for a broad variety of semiconductor technologies including bipolar and MOS technologies.

In an aspect of the invention, an apparatus is provided, which comprises a drift trimming stage. The drift trimming stage comprises a first current source having a first temperature dependency and a second current source having a second temperature dependency. A current source can be any stage or circuit that supplies or sinks a current. The temperature dependencies of the first and the second current sources are different. In other words, the variation of the current as a function of the temperature of the apparatus is different for the first and the second current source. The first current source and the second current source can then be coupled in order to combine a current from the first current source with a current from the second current source. The resulting current is then a first trimming current. The current from the first current source can be added to or subtracted from the current from the second current source. The drift trimming stage further comprises a third current source having a third temperature dependency and a fourth current source having a fourth temperature dependency. The temperature dependencies of the third and the fourth current sources are different. In other words, the variation of the current as a function of the temperature of the apparatus is different for the third and the fourth current source. The third current source and the fourth current source can then be coupled in order to combine a current from the third current source with a current from the fourth current source. The resulting current may then be a second trimming current. The current from the third current source can be added to or subtracted from the current from the fourth current source. The first temperature dependency and third temperature dependency may be substantially equal. The second temperature dependency and fourth temperature dependency may be substantially equal. The drift trimming stage may be configured to supply the first trimming current from a first node to the first resistor. The drift trimming stage may be configured to supply the second trimming current from a second node to the second resistor. The first resistor and the second resistor may be coupled in series at a third node. This can provide a combined voltage drop between the first node and the second node across the first resistor and the second resistor having a suitable temperature dependency for compensating an offset drift.

The different temperature dependencies (i.e., two) of the current sources generally provide that the combined voltage drop can compensate an offset drift. The temperature dependencies of the first and second currents sources may be a substantially linear function of the temperature. The slopes of the linear function may have different absolute values and/or different signs for the two current sources. For example, the first current source and the third current source may provide (source or sink) a current that increases linearly with increasing temperature (positive slope), and the second current source and the fourth current source may provide (source or sink) a current that decreases linearly with increasing temperature (negative slope). The two linear functions of the currents of the first and second current source may then have an intersection. Having an intersection means that the magnitudes of the currents of the first, second, third and fourth current source are substantially equal (except the respective different signs). This provides that the sign of the trimming current can change. According to this aspect of the invention, an offset and offset drift trimming circuit is provided that does not require digital components for offset and offset drift reduction. A circuitry in accordance with these aspects of the invention requires only about half the chip area, is simpler and more robust than prior art solutions.

The apparatus may then be configured to produce a combined voltage drop across the first resistor R1 and the second resistor R2 that may be described by the following equation:

$$VOUT = ITRIM1 \cdot R1 - ITRIM2 \cdot R2, \quad (1)$$

where VOUT is the voltage drop across the first resistor R1 and the second resistor R2 and ITRIM1 is the first trimming current and ITRIM2 is the second trimming current. Equation (1) can be simplified as follows if currents ITRIM1 and ITRIM2 are assumed to be equal (i.e., ITRIM=ITRIM1=ITRIM2):

$$VOUT = ITRIM \times (R1 - R2) \quad (2)$$

Equation (2) shows that VOUT can be a linear function of the trimming current ITRIM, if the resistance values of the first resistor R1 and the second resistor R2 are not equal.

If the resistance value of the first resistor R1 is greater than the resistance value of the second resistor R2, and assuming that the trimming current ITRIM has a positive temperature coefficient, this results in a positive temperature coefficient of the combined voltage VOUT. If the resistance value of the first resistor R1 is lower than the resistance value of the second resistor R2, this results in a negative temperature coefficient of the combined voltage VOUT. Therefore, it is possible to adjust slope and sign of the temperature behavior of the combined voltage drop VOUT through trimming currents and resistor values in order to compensate any offset voltage drift of another stage or circuit. The combined output voltage VOUT may be fed to a stage or circuit that needs offset drift compensation as an inverse function of the actual offset drift of the other stage or circuit.

In an aspect of the invention, the apparatus may be configured such that the first trimming current is zero at a first temperature and the second trimming current is also zero at the first temperature. The magnitudes and signs of the trimming current(s) may be adjusted in a laser trimming step. The first, second, third and/or fourth current source(s) may then be configured to be adjusted in a laser trimming step that provides that the first trimming current and/or the second trimming current are adjusted. The first and the second trimming current may then be adjusted to become zero at a first temperature.

In another aspect of the invention, the first resistor and/or the second resistor may be configured to be adjusted in a second laser trimming step. The apparatus may then be heated to a second temperature and the second trimming step may be performed at this second temperature. The offset may be measured and the first resistor and/or the second resistor may then be adjusted in order to compensate the offset at the second temperature. The voltage drop across the first and second resistor may then be configured to have an inverse temperature behavior compared with the behavior of the offset drift of a stage or circuit that is to be offset drift compensated.

The first and/or third current source(s) may be coupled to (or comprise) a proportional-to-absolute-temperature (PTAT) current generator. The second current source may be coupled to or comprise a complementary-to-absolute-temperature (CTAT) current generator. CTAT means that the temperature dependency is complementary (i.e. opposite) to the PTAT current source. PTAT refers to a ΔVbe (ratio of a change of base-emitter voltage Vbe), while CTAT refers to Vbe (i.e. a current with a magnitude proportional to a base-emitter voltage Vbe).

In accordance with a preferred embodiment of the present invention, the drift trimming stage, and more specifically the first, second, third and fourth current sources, may comprise current mirrors for providing the first trimming current at the first node and the second trimming current at the second node being coupled to one PTAT current generator and one CTAT current generator.

In accordance with a preferred embodiment of the present invention, a second PTAT current generator and a second CTAT current generator may be provided which may then be coupled to or incorporated in either of the current sources. They may then be configured to have equal currents at the first temperature. If more than one PTAT and CTAT current generators are used, the respective current sources of the same type may be matched. The currents of the PTAT current generator and the CTAT current generator may be adjusted to be equal at the first temperature. This may be the result of a trimming step of one or more of the current sources. This means that the voltage drop across the first resistor and the second resistor is zero at the first temperature. If the current of the PTAT current generator changes due to temperature variations, this will result in a voltage drop across the first and the second resistor. It is an inherent characteristic of a PTAT current source that its current is proportional to the absolute temperature (i.e. also a linear function of the temperature).

The first and the second resistor may be coupled together at a third node and the apparatus may further comprise a common voltage source coupled to the third node. This is useful in order to provide enough headroom for the current sources.

The apparatus may further comprise an amplifier coupled to receive the combined voltage drop across the first and the second resistor or a signal derived from the combined voltage drop for compensating an offset drift of the amplifier.

In accordance with a preferred embodiment of the present invention, the apparatus may further comprise a voltage or current source, as for example a bandgap reference voltage source, instead of or in addition to the amplifier. The reference voltage source or the reference current source may be coupled to receive the combined voltage drop across the first and the second resistor or a signal derived from the combined voltage drop for compensating an offset drift of the reference voltage or current source.

In accordance with a preferred embodiment of the present invention, a transconductance amplifier may be coupled with a first input to the first node and with a second input to the second node and with an output to a stage or circuit that needs to be offset drift compensated. The stage or circuit may be an amplifier or a bandgap reference generator. This provides that a current can be provided to another stage or circuit which can be a linear function of the voltage drop and therefore suitable to compensate the offset drift of the other stage.

In accordance with a preferred embodiment of the present invention, a method is provided that compensates for an offset drift. A first current having a first temperature dependency may be combined with a second current having a second temperature dependency that is different from the first temperature dependency. This can be done for generating a first trimming current. A third current having a third temperature dependency may be combined with a fourth current having a fourth temperature dependency that is different from the third temperature dependency. This may be done for generating a second trimming current. The first trimming current and the second trimming current may then be used for generating a voltage drop. The voltage drop can then be used for compensating an offset drift. The voltage drop may be generated by feeding the first trimming current and the second trimming current to respective first and second resistors. In an embodiment, a difference current of a current of a PTAT current generator having a first magnitude at a first temperature and a current of a CTAT current generator having the first magnitude at the first temperature may be used as the first and/or second trimming current. The first and/or second trimming current may then be supplied to a first and/or second resistor. A combined voltage drop across the first and the second resistor may then be used for reducing an offset drift of another stage, as for example an amplifier or a reference voltage/current generator. A first trimming step may be performed for adjusting the magnitudes of the current of one or more of the current sources at a first temperature. A second trimming step may be performed for adjusting the voltage drop (sign and/or magnitude of the voltage drop) at a second temperature.

In accordance with a preferred embodiment of the present invention, an apparatus is provided. The apparatus comprises a first node; a second node; a third node; a first proportional-to-absolute-temperature (PTAT) current source that is coupled to the first node; a first complementary-to-absolute-temperature (CTAT) current source that is coupled to the first node; a second PTAT current source that is coupled to the second node; a second CTAT current source that is coupled to the second node; a first adjustable resistor that is coupled between the first node and the third node; a second adjustable resistor that is coupled between the second node and the third node; and a common mode voltage source that is coupled to the third node.

In accordance with a preferred embodiment of the present invention, the apparatus further comprises an amplifier that is coupled to the first and second nodes.

In accordance with a preferred embodiment of the present invention, the first and second PTAT current sources further comprise: a PTAT current generator; a first transistor that is coupled to the PTAT current generator and the first node; and a second transistor that is coupled to the PTAT current generator and the second node.

In accordance with a preferred embodiment of the present invention, the first and second CTAT current sources further comprise: a CTAT current generator that is coupled to the PTAT current generator; a third transistor that is coupled to the CTAT generator; a current mirror that is coupled to the third transistor; a fourth transistor that is coupled to the current minor and the first node; and a fifth transistor that is coupled to the current mirror and the second node.

In accordance with a preferred embodiment of the present invention, the apparatus further comprises a CTAT-PTAT measurement circuit that is coupled to the PTAT current generator and the current minor.

In accordance with a preferred embodiment of the present invention, an apparatus is provided. The apparatus comprises output circuitry that receives an input signal; and a drift trimming stage including: a first node that is coupled to the output circuitry; a second node that is coupled to the output circuitry; a third node; a first PTAT current source that is coupled to the first node; a first CTAT current source that is coupled to the first node; a second PTAT current source that is coupled to the second node; a second CTAT current source that is coupled to the second node; a first adjustable resistor that is coupled between the first node and the third node; a second adjustable resistor that is coupled between the second node and the third node; and a common mode voltage source that is coupled to the third node.

In accordance with a preferred embodiment of the present invention, the drift trimming stage further comprises an amplifier that is coupled between the first and second nodes and the output circuitry.

In accordance with a preferred embodiment of the present invention, the amplifier further comprises a first amplifier, and wherein the output circuitry further comprises: an input stage that is coupled to the first amplifier; and a second amplifier that is coupled to the input stage.

In accordance with a preferred embodiment of the present invention, the current mirror further comprises a first current mirror, and wherein the input stage further comprises: a first resistor; a second resistor; a second current mirror that is coupled to the first and second resistors; and a differential pair of transistors that receives the input signal and that is coupled to the second current mirror and the first amplifier.

In accordance with a preferred embodiment of the present invention, an apparatus is provided. The apparatus comprises output circuitry that receives an input signal; and a drift trimming stage including: a first node that is coupled to the output circuitry; a second node that is coupled to the output circuitry; a third node; a PTAT current generator having: a first diode-connected transistor; a first transistor that is coupled to the base of the first diode-connected transistor; a second transistor that is coupled to the base of the first diode-connected transistor; a third transistor that is coupled to the collector of the first diode-connected transistor at its emitter and to the collector of the first transistor at its base; a second diode-connected transistor that is coupled to the collector of the second transistor at its collector; and a fourth transistor that is coupled to the base of the third transistor at its collector and to the base of the second diode-connected transistor at its base; a CTAT current generator having: a first resistor; a second resistor; a third diode-connected transistor that is coupled to the first resistor at its emitter; a fifth transistor that is coupled to the second resistor at its emitter and to the base of the third diode-connected transistor at its base; and a sixth transistor that is coupled to the collector of the third diode-connected transistor at its collector and to the collector of the fourth transistor at its base; a seventh transistor that is coupled to the collector of the fifth transistor at its base; a fourth diode-connected transistor that is coupled to the emitter of the seventh transistor at its collector; an eighth transistor that is coupled to the base of the first diode-connected transistor at its base and to the first node at its collector; a ninth transistor that is coupled to the base of the first diode-connected transistor at its base and to the second node at its collector; a tenth transistor that is coupled to the base of the fourth diode-connected transistor at its base and to the first node at its collector; an eleventh transistor that is coupled to the base of the fourth diode-connected transistor at its base and to the second node at its collector; a first adjustable resistor that is coupled between the first node and the third node; a second adjustable resistor that is coupled between the second node and the third node; and a common mode voltage source that is coupled to the third node.

In accordance with a preferred embodiment of the present invention, the first and second resistors are adjustable.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF DRAWINGS

For a more complete understanding of the present invention, and the advantages thereof, reference is now made to the following descriptions taken in conjunction with the accompanying drawings, in which.

DETAILED DESCRIPTION

Refer now to the drawings wherein depicted elements are, for the sake of clarity, not necessarily shown to scale and wherein like or similar elements are designated by the same reference numeral through the several views.

Figure 1:
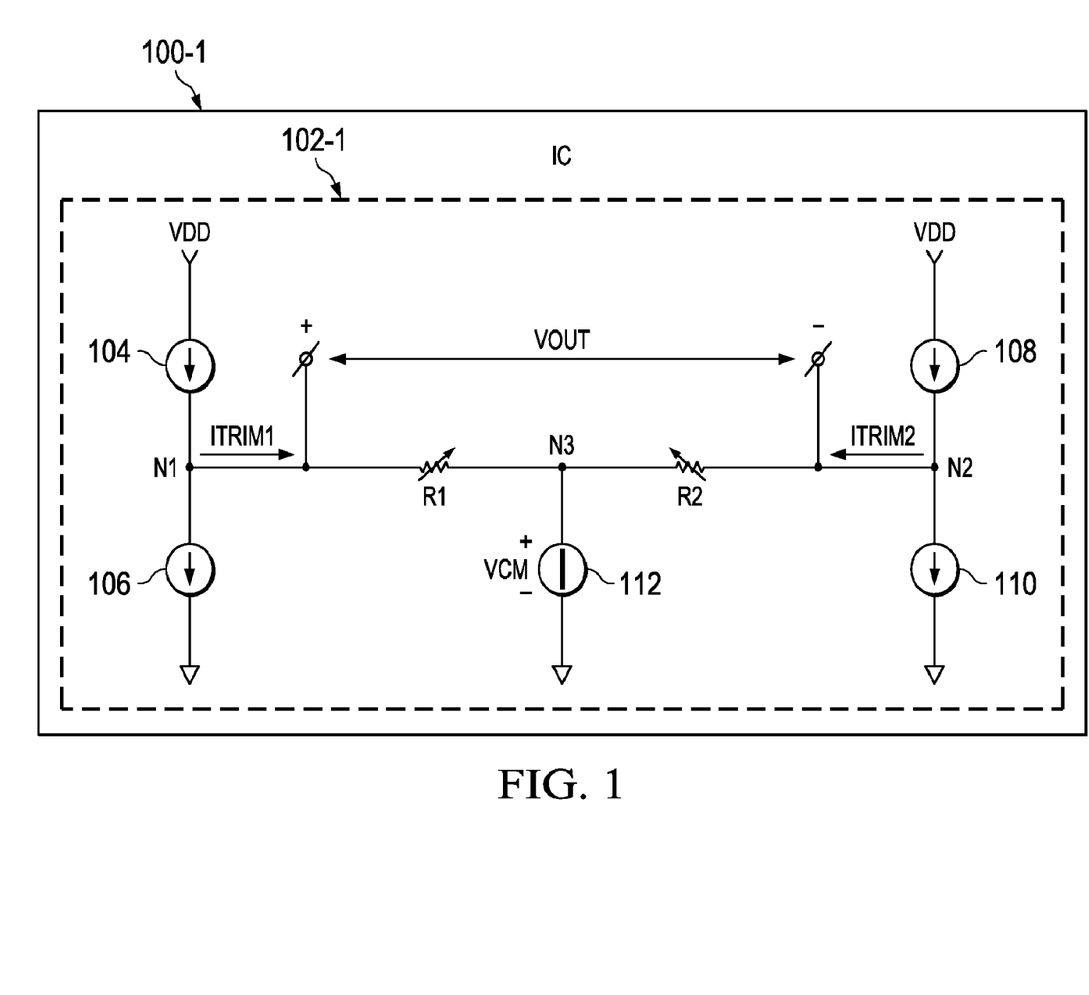
FIG. 1 is simplified circuit diagram of an example of an integrated circuit (IC) in accordance with a preferred embodiment of the present invention.

Turning to FIG. 1, an example of an integrated circuit (IC) 100-1 in accordance with a preferred embodiment of the present invention can be seen. IC 100-1 generally comprises a drift trimming stage 102-1. This drift trimming stage generally comprises current sources 104, 106, 108, and 110 (which each have a temperature dependency), and variable resistors R1 and R2. Typically, current sources 104 and 108 provide a proportional-to-absolute-temperature (PTAT) current, while current sources 106 and 110 generally provide a complementary-to-absolute-temperature (CTAT) current. In operation, current source 104 supplies a current to node N1, while current source 106 sinks a current from node N1, which results in trimming current ITRIM1. Similarly, current sources 108 and 110 generate trimming current ITRIM2 at node N2. The current sources 104 and 108 may be current mirrors which are coupled to a single or to two PTAT current generators. Advantageously, when both current sources 104 and 108 are coupled to the same PTAT current generators, source currents for nodes N1 and N2 have the same magnitude and temperature behavior. Furthermore, current sources 106 and 110 may be current mirrors which may be coupled to one or more CTAT current generators. Advantageously, when both current sources 106 and 110 are coupled to the same CTAT current source, the currents sunk from nodes N1 and N2 have the same magnitude and temperature behavior.

As a result, current sources 104, 106, 108, and 110 may all be configured to source and sink currents of the same magnitudes at a predetermined temperature T1. This means that 104 source a current of a first magnitude at a first temperature T1 to node N1 and current source 106 sinks the same amount of current from node N1. Current source 108 may then source the same amount of current to node N2 which is sunk by current source 110. Therefore, trimming currents ITRIM1 and ITRIM2 are zero at temperature T1. However, if the absolute temperature rises above or falls below the first temperature T1, positive or negative trimming currents ITRIM1 and ITRIM2 are supplied through the resistors R1 and R2 to node N3, which are coupled to nodes N1 and N2, respectively. Additionally, a common voltage source VCM can be coupled between ground and node N3. The combined voltage drop VOUT across resistors R1 and R2 may then be used for compensating an offset drift of a stage or circuit that can be coupled to nodes N1 and N2.

Figure 2:
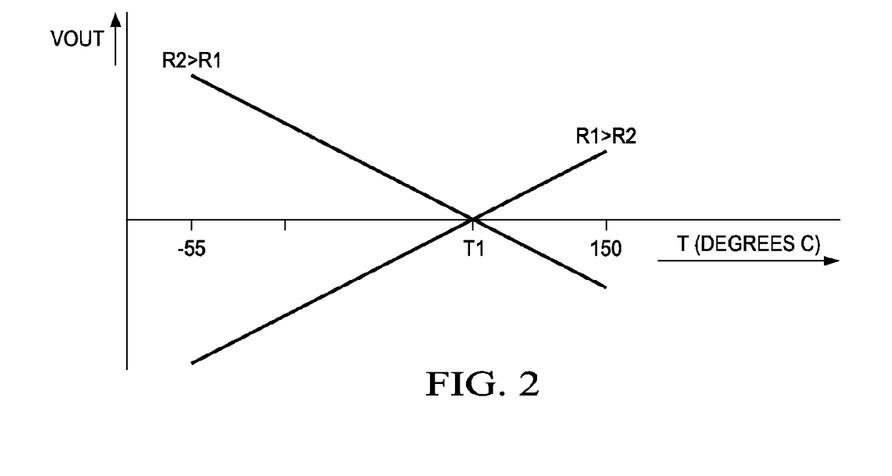
FIG. 2 is an diagram showing the output voltage as a function of the temperature of the IC of FIG. 1.

Turning to FIG. 2, a simplified diagram illustrating the output voltage VOUT of the drift trimming stage 102-1 can be seen. If the resistance value of resistor R2 is greater than the resistance value of resistor R1 (R2>R1), the output voltage VOUT becomes a linear function of the temperature T with a negative temperature slope with an intersection with the abscissa at temperature T1. If the resistance value of resistor R1 is greater than the resistance value of resistor R2 (R1>R2), the output voltage VOUT is a linear function of the temperature T with a positive temperature slope with an intersection with the abscissa at temperature T1. This means that the drift trimming stage 102-1 allows the offset drift to be compensated.

Figure 3:
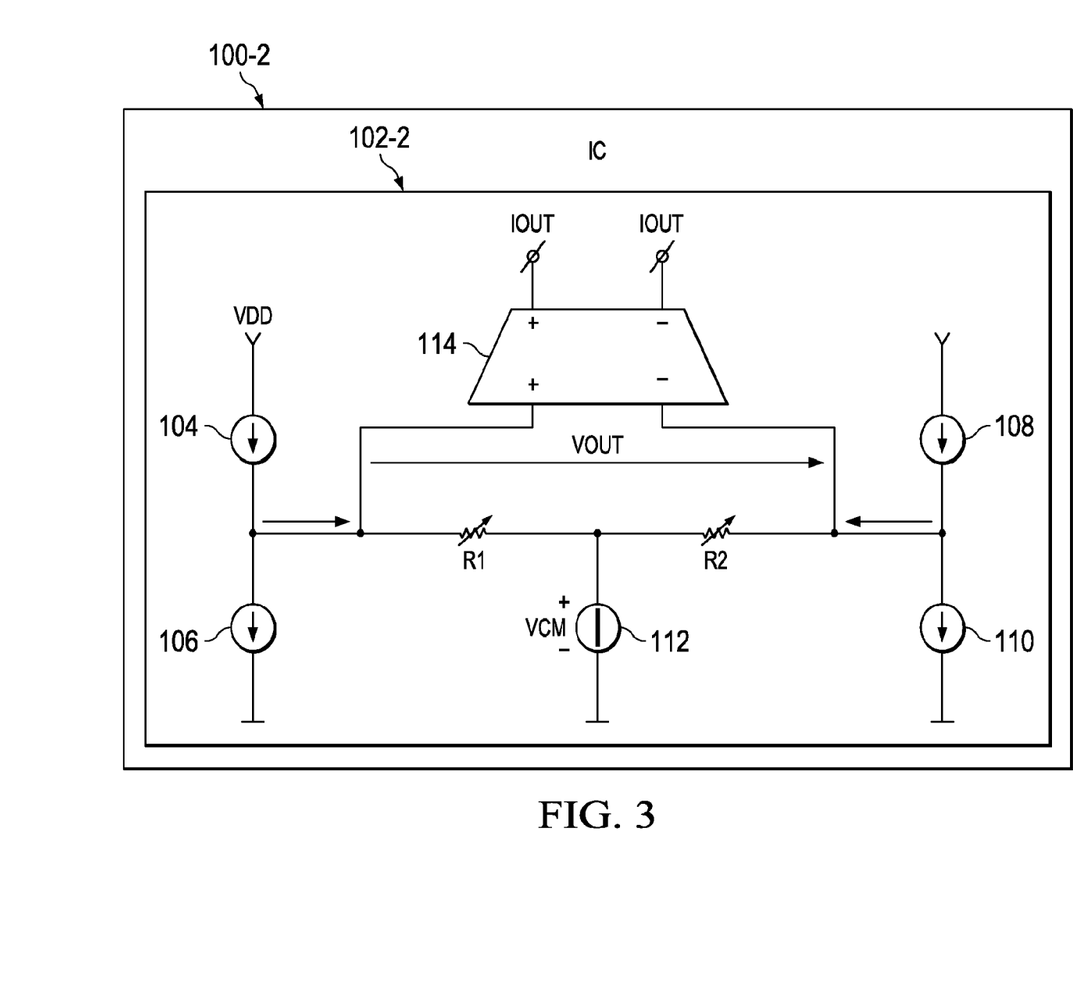
FIGS. 3, 4, and 5 are simplified circuit diagrams of examples of ICs in accordance with a preferred embodiment of the present invention.

In FIG. 3, a simplified circuit diagram of an IC 100-2 can be seen. Similar to IC 100-1, IC 100-2 generally includes a drift trimming stage 102-2. A difference between drift trimming stages 102-1 and 102-2 is that drift trimming stage 102-2 includes a transconductance amplifier 114. This transconductance amplifier 114 generally converts the output voltage VOUT into a corresponding output current IOUT. Here, the transconductance amplifier 114 may preferably have a nonlinearity of (for example) less than or equal to 1%. There are two further sources of inaccuracy. Also, current sources 104/108 and 106/110 should, however, be matched. Moreover, it should also be generally ensured that that the trim currents ITRIM1 and ITRIM2 are generally equal to zero at temperature T1. An extra trimming step may also be performed in order to achieve zeroing of trimming currents ITRIM1 and ITRIM2 at temperature T1. The common voltage source VCM provides a common voltage level to node N3 which should sufficient for the current sources 104, 106, 108, and 110 for proper operation.

Figure 4:
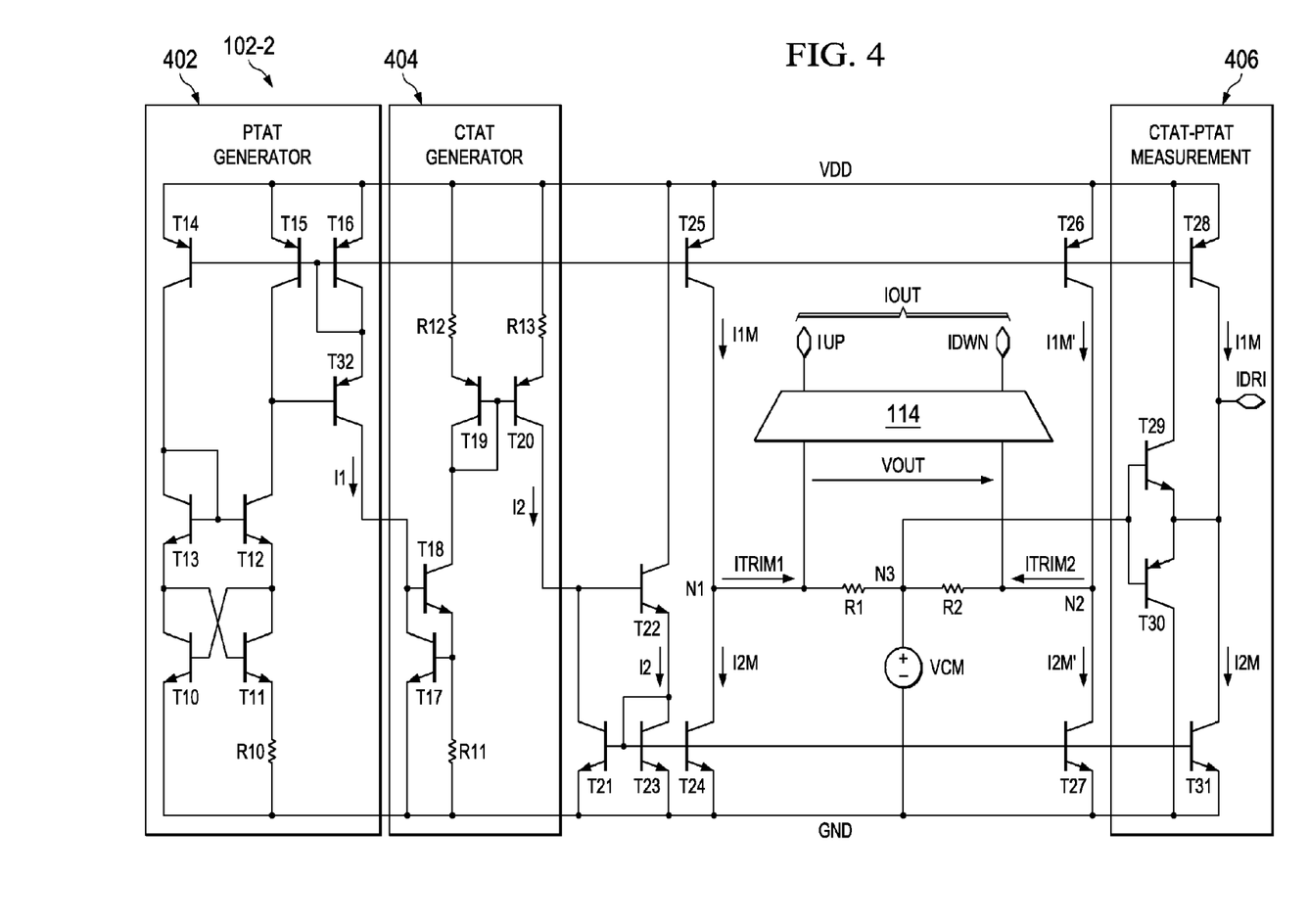

Turning now to FIG. 4, an example of drift trimming stage 102-2 can be seen in greater detail. Here, current sources 104, 106, 108, and 110 can respectively comprise PTAT current generator 402 and transistor T25, CTAT current generator 404 and transistors T20, T22, T23, and T24, PTAT current generator 402 and transistor T26, and CTAT current generator 404 and transistors T20, T21, T22, T23, and T27. The PTAT current generator 402 generally comprises transistors T10, T11, T12, T13, T14, T15, T16, and T32 and resistor R10. With this configuration, PTAT current source 402 supplies a current I1 at the collector of transistor T32, which is proportional to absolute temperature. CTAT current generator 404 generally comprises transistors T17, T18, T19, and T20 and resistors R11, R12, and R13. Resistors R12 and R13 are trimmable resistors for adjusting the current I2 supplied by the CTAT current generator 404, which has a negative temperature coefficient and is complementary to absolute temperature.

PTAT current generator 402 is based on a ΔVbe-cell including transistors T10 and T11 having different emitter areas. The basic principle of a ΔVbe-cell is known in the art. The base-emitter voltage decreases with temperature (i.e., −2 mV/K). However, the ΔVbe-cell is configured to have a positive temperature coefficient. The current through transistor T16 has a positive temperature coefficient and is mirrored to transistors T25 and T26, which operate as current sources 104 and 108 supplying currents I1M and I1M' to nodes N1 and N2. Each of currents I1M and I1M' generally have about the same temperature dependency.

CTAT current generator 404 receives current I1 from PTAT current generator 402. Current I1 also has the positive temperature dependency produced by the ΔVbe-cell (i.e., transistors T10, T11, R10). However, the temperature dependency of current I1 is not required for the CTAT current generator 402. Any bias current can be used. Here, however, a current I1 with a positive temperature dependency is used, as generating a constant bias current for the CTAT current generator 404 generally requires additional complex circuitry. Transistors T17 and T18 are coupled to produce a collector current of T18 which has a negative temperature coefficient in accordance with a change of the base-emitter voltage Vbe. The collector current of transistor T18 is mirrored through transistors T19 and T20 to current I2, which has the temperature dependency of the CTAT current generator 404. Current I2 is then mirrored to transistors T24 and T27, which operate as current sources 106 and 110. Accordingly, currents I2M and I2M' are copies of current I2 and have the temperature behavior given by the CTAT current generator 404. Transistors T24 and T27 sink currents I2M and I2M' from nodes N1 and N2, respectively.

In a first trimming step, currents I1M/I1M' (or current I1) and I2M/I2M' (or current I2) are adjusted to have the same magnitude at a first temperature T1. In order to achieve this, CTAT-PTAT measurement circuit 406 is used. Circuit 406 generally comprises transistors T28, T29, T30, and T31. In operation, the current at pin IDRI is measured at a first temperature T1 and resistors R12 and/or R13 are trimmed until the output current at IDRI becomes zero. This provides that the first trimming current ITRIM1 at node N1 and the second trimming current ITRIM2 at node N2 are also zero at temperature T1 as currents I1M/I1M' and I2M/I2M' are added (subtracted) at nodes N1 and N2. If the temperature of the IC 100-2 increases, currents I1M/I1M' (or current I1) will increase and currents I2M/I2M' (or current I2) will decrease. If the temperature of the IC 100-2 decreases, currents I1M/I1M' (or current I1) will decrease and currents I2M/I2M' (or current I2) will increase. The first trimming current ITRIM1 and the second trimming current ITRIM2 will increase or decrease, accordingly. The common voltage source VCM is coupled to node N3, where resistors R1 and R2 are coupled, in order to provide sufficient headroom for transistors T24 to T27 (the current minor transistors).

An output voltage VOUT is generated across resistors R1 and R2 with the first and the second trimming current ITRIM1 and ITRIM2. This output voltage VOUT can then be a linear function of the temperature. The slope of the linear temperature dependency of VOUT can be adjusted in a second trimming step, by trimming resistors R1 and R2 as explained with respect to FIG. 2.

A transconductance amplifier 114 may also be provided and coupled to nodes N1 and N2 in order to convert the output voltage VOUT in a corresponding output current TOUT (i.e., IUP and IDWN), which may then be fed to another stage that is to be offset drift compensated. The second trimming step may be performed by measuring and evaluating the actual offset of the stage that is to be compensated.

As an alternative, only one of the resistors R1 or R2 may be adjustable. However, as shown, both resistors are adjustable. Using two adjustable or trimmable resistors allows absolute and relative mismatch errors due to production spread to be compensated. This applies also to resistors R12 and R13. The trimming may be performed by a laser cutting step of resistor structures.

Figure 5:
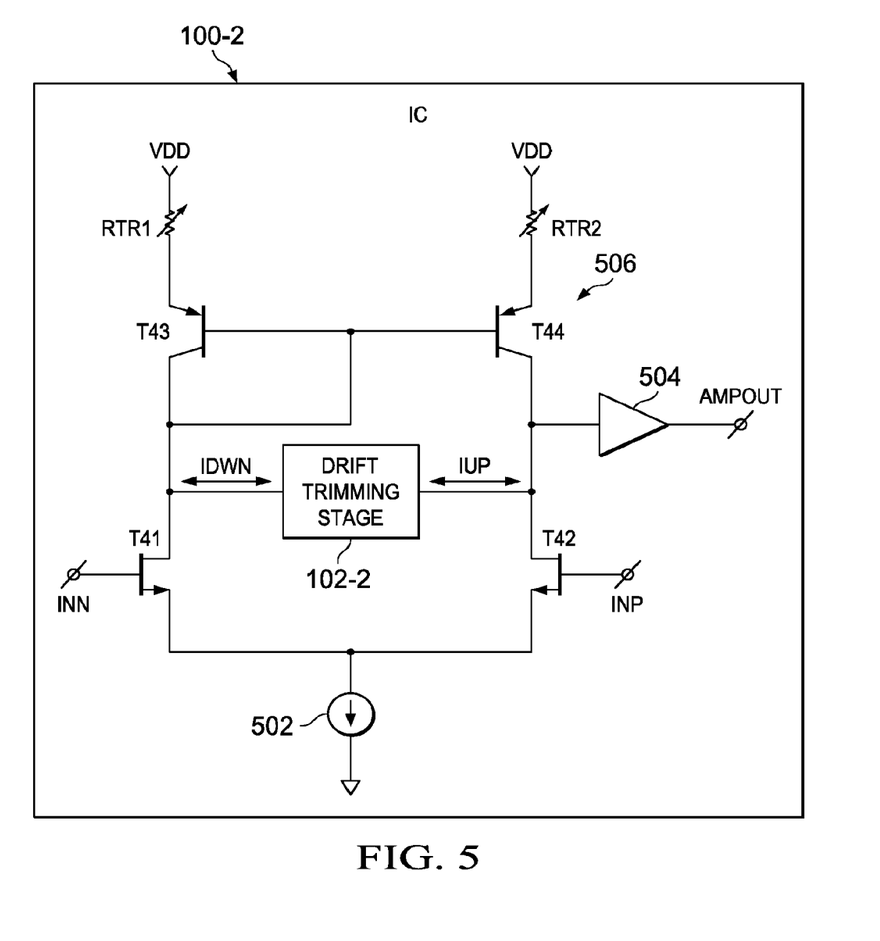

Turning now to FIG. 5, an example of IC 100-2 can be seen. Here, IC 100-2 includes an amplifier having an offset drift. The drift trimming stage 102-2 provides currents IUP and IDWN to an input stage 506 of the amplifier. The input stage 506 generally comprises transistors T41, T42, T43, and T44, resistors RTR1 and RTR2 and a current source 502. Resistors RTR1 and RTR2 may be adjustable in order to compensate an offset of the input stage 506. Further, offset trimming and offset drift trimming may then be performed with drift trimming stage 102-2 as explained above. As a result, currents IDWN and IUP may have magnitudes and signs suitable to compensate an offset drift due to temperature variations. Current IDWN and IUP from the drift trimming stage 102-2 are generally coupled to the two sides of the differential pair T41 and T42 for feeding currents through the channels of the input transistors T41 and T42. The input transistors T41 and T42 are coupled with their channels between the load transistors T43 and T44 and the bias current source 502. The control gate of transistor T41 receives the negative input signal INN and the control gate of transistor T42 receives the positive input INP, respectively. The differential pair T41 and T42 is coupled to amplifier 504, which provides the output signal AMPOUT of the amplifier. Due to mismatch and temperature variations, the output signal AMPOUT may have an offset and offset drift. This offset and offset drift can be compensated by feeding additional currents IUP and IDWN through transistors T41 and T42, respectively.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   a first node;
   a second node;
   a third node;
   a first proportional-to-absolute-temperature (PTAT) current source that is coupled to the first node;
   a first complementary-to-absolute-temperature (CTAT) current source that is coupled to the first node;
   a second PTAT current source that is coupled to the second node;
   a second CTAT current source that is coupled to the second node;
   a first adjustable resistor that is coupled between the first node and the third node;
   a second adjustable resistor that is coupled between the second node and the third node; and
   a common mode voltage source that is coupled to the third node.

2. The apparatus of claim 1, wherein the apparatus further comprises an amplifier that is coupled to the first and second nodes.

3. The apparatus of claim 2, wherein the first and second PTAT current sources further comprise:
   a PTAT current generator;
   a first transistor that is coupled to the PTAT current generator and the first node; and
   a second transistor that is coupled to the PTAT current generator and the second node.

4. The apparatus of claim 3, wherein the first and second CTAT current sources further comprise:
   a CTAT current generator that is coupled to the PTAT current generator;
   a third transistor that is coupled to the CTAT current generator;
   a current mirror that is coupled to the third transistor;
   a fourth transistor that is coupled to the current mirror and the first node; and
   a fifth transistor that is coupled to the current mirror and the second node.

5. The apparatus of claim 4, wherein the apparatus further comprises a CTAT-PTAT measurement circuit that is coupled to the PTAT current generator and the current mirror.

6. An apparatus comprising:
   output circuitry that receives an input signal; and
   a drift trimming stage including:
      a first node that is coupled to the output circuitry;
      a second node that is coupled to the output circuitry;
      a third node;
      a first PTAT current source that is coupled to the first node;
      a first CTAT current source that is coupled to the first node;
      a second PTAT current source that is coupled to the second node;
      a second CTAT current source that is coupled to the second node;
      a first adjustable resistor that is coupled between the first node and the third node;
      a second adjustable resistor that is coupled between the second node and the third node; and
      a common mode voltage source that is coupled to the third node.

7. The apparatus of claim 6, wherein the drift trimming stage further comprises an amplifier that is coupled between the first and second nodes and the output circuitry.

8. The apparatus of claim 7, wherein the first and second PTAT current sources further comprise:
a PTAT current generator;
a first transistor that is coupled to the PTAT current generator and the first node; and
a second transistor that is coupled to the PTAT current generator and the second node.

9. The apparatus of claim 8, wherein the first and second CTAT current sources further comprise:
a CTAT current generator that is coupled to the PTAT current generator;
a third transistor that is coupled to the CTAT current generator;
a current mirror that is coupled to the third transistor;
a fourth transistor that is coupled to the current mirror and the first node; and
a fifth transistor that is coupled to the current mirror and the second node.

10. The apparatus of claim 9, wherein the apparatus further comprises a CTAT-PTAT measurement circuit that is coupled to the PTAT current generator and the current mirror.

11. The apparatus of claim 10, wherein the amplifier further comprises a first amplifier, and wherein the output circuitry further comprises:
an input stage that is coupled to the first amplifier; and
a second amplifier that is coupled to the input stage.

12. The apparatus of claim 11, wherein the current mirror further comprises a first current mirror, and wherein the input stage further comprises:
a first resistor;
a second resistor;
a second current mirror that is coupled to the first and second resistors; and
a differential pair of transistors that receives the input signal and that is coupled to the second current mirror and the first amplifier.

13. An apparatus comprising:
output circuitry that receives an input signal; and
a drift trimming stage including:
a first node that is coupled to the output circuitry;
a second node that is coupled to the output circuitry;
a third node;
a PTAT current generator having:
a first diode-connected bipolar transistor;
a first bipolar transistor that that is coupled to the base of the first diode-connected bipolar transistor;
a second bipolar transistor that is coupled to the base of the first diode-connected bipolar transistor;
a third bipolar transistor that is coupled to the collector of the first diode-connected bipolar transistor at its emitter and to the collector of the first bipolar transistor at its base;
a second diode-connected bipolar transistor that is coupled to the collector of the second bipolar transistor at its collector; and
a fourth bipolar transistor that is coupled to the base of the third bipolar transistor at its collector and to the base of the second diode-connected transistor at its base;
a CTAT current generator having:
a first resistor;
a second resistor;
a third diode-connected bipolar transistor that is coupled to the first resistor at its emitter;
a fifth bipolar transistor that is coupled to the second resistor at its emitter and to the base of the third diode-connected bipolar transistor at its base; and
a sixth bipolar transistor that is coupled to the collector of the third diode-connected bipolar transistor at its collector and to the collector of the third bipolar transistor at its base;
a seventh bipolar transistor that is coupled to the collector of the fifth bipolar transistor at its base;
a fourth diode-connected bipolar transistor that is coupled to the emitter of the seventh bipolar transistor at its collector;
an eighth bipolar transistor that is coupled to the base of the first diode-connected bipolar transistor at its base and to the first node at its collector;
a ninth bipolar transistor that is coupled to the base of the first diode-connected bipolar transistor at its base and to the second node at its collector;
a tenth bipolar transistor that is coupled to the base of the fourth diode-connected bipolar transistor at its base and to the first node at its collector;
an eleventh bipolar transistor that is coupled to the base of the fourth diode-connected bipolar transistor at its base and to the second node at its collector;
a first adjustable resistor that is coupled between the first node and the third node;
a second adjustable resistor that is coupled between the second node and the third node; and
a common mode voltage source that is coupled to the third node.

14. The apparatus of claim 13, wherein the drift trimming stage further comprises an amplifier that is coupled between the first and second nodes and the output circuitry.

15. The apparatus of claim 14, wherein the first and second resistors are adjustable.

16. The apparatus of claim 15, wherein the apparatus further comprises a CTAT-PTAT measurement circuit that is coupled to the PTAT current generator.

17. The apparatus of claim 16, wherein the amplifier further comprises a first amplifier, and wherein the output circuitry further comprises:
an input stage that is coupled to the first amplifier; and
a second amplifier that is coupled to the input stage.

18. The apparatus of claim 17, wherein the input stage further comprises:
a current mirror; and
a differential pair of transistors that receives the input signal and that is coupled current mirror and the first amplifier.

* * * * *